(12) United States Patent
Oshima

(10) Patent No.: US 6,893,964 B2
(45) Date of Patent: May 17, 2005

(54) CLEANING METHOD FOR SUBSTRATE TREATMENT DEVICE AND SUBSTRATE TREATMENT DEVICE

(75) Inventor: Yasuhiro Oshima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 6 days.

(21) Appl. No.: 10/471,579
(22) PCT Filed: Mar. 5, 2002
(86) PCT No.: PCT/JP02/02008
§ 371 (c)(1), (2), (4) Date: Sep. 12, 2003
(87) PCT Pub. No.: WO02/073675
PCT Pub. Date: Sep. 19, 2002

(65) Prior Publication Data
US 2004/0115951 A1 Jun. 17, 2004

(30) Foreign Application Priority Data
Mar. 14, 2001 (JP) .................................. 2001-072711

(51) Int. Cl.⁷ ............................................. H01L 21/44
(52) U.S. Cl. ..................................................... 438/680
(58) Field of Search ................................. 438/680, 681, 438/683, 8, 9, 479, 483, 502, 517, 684, 686, 905, 935

(56) References Cited

U.S. PATENT DOCUMENTS

| 4,250,225 A | * | 2/1981 | Shirahata et al. | ........... 428/336 |
|---|---|---|---|---|
| 4,393,092 A | * | 7/1983 | Gill | .............................. 427/38 |
| 4,765,860 A | * | 8/1988 | Ueno et al. | .............. 156/272.6 |
| 5,178,962 A | * | 1/1993 | Miyamoto et al. | .......... 428/463 |
| 6,383,346 B2 | * | 5/2002 | Ando et al. | ............ 204/192.26 |

FOREIGN PATENT DOCUMENTS

| DE | 19833448 A1 | 2/2000 |
|---|---|---|
| EP | 774778 A2 | 5/1997 |
| JP | 9-181054 | 7/1997 |
| JP | 10-223614 | 8/1998 |
| JP | 2000-096241 | 4/2000 |
| WO | 98/36449 A1 | 8/1998 |

* cited by examiner

Primary Examiner—David Nhu
(74) Attorney, Agent, or Firm—Crowell & Moring LLP

(57) ABSTRACT

A cleaning gas that is obtained by vaporizing a carboxylic acid is supplied into a treatment chamber having an insulating substance adhering to the inside thereof, and the inside of the treatment chamber is evacuated. When the cleaning gas supplied into the treatment chamber comes in contact with the insulating substance adhering to an inside wall and a susceptor in the treatment chamber, the insulating substance is turned into a complex, so that the complex of the insulating substance is formed. The complex of the insulating substance is easily vaporized due to its high vapor pressure. The vaporized complex of the insulating substance is discharged out of the treatment chamber by the evacuation.

9 Claims, 10 Drawing Sheets

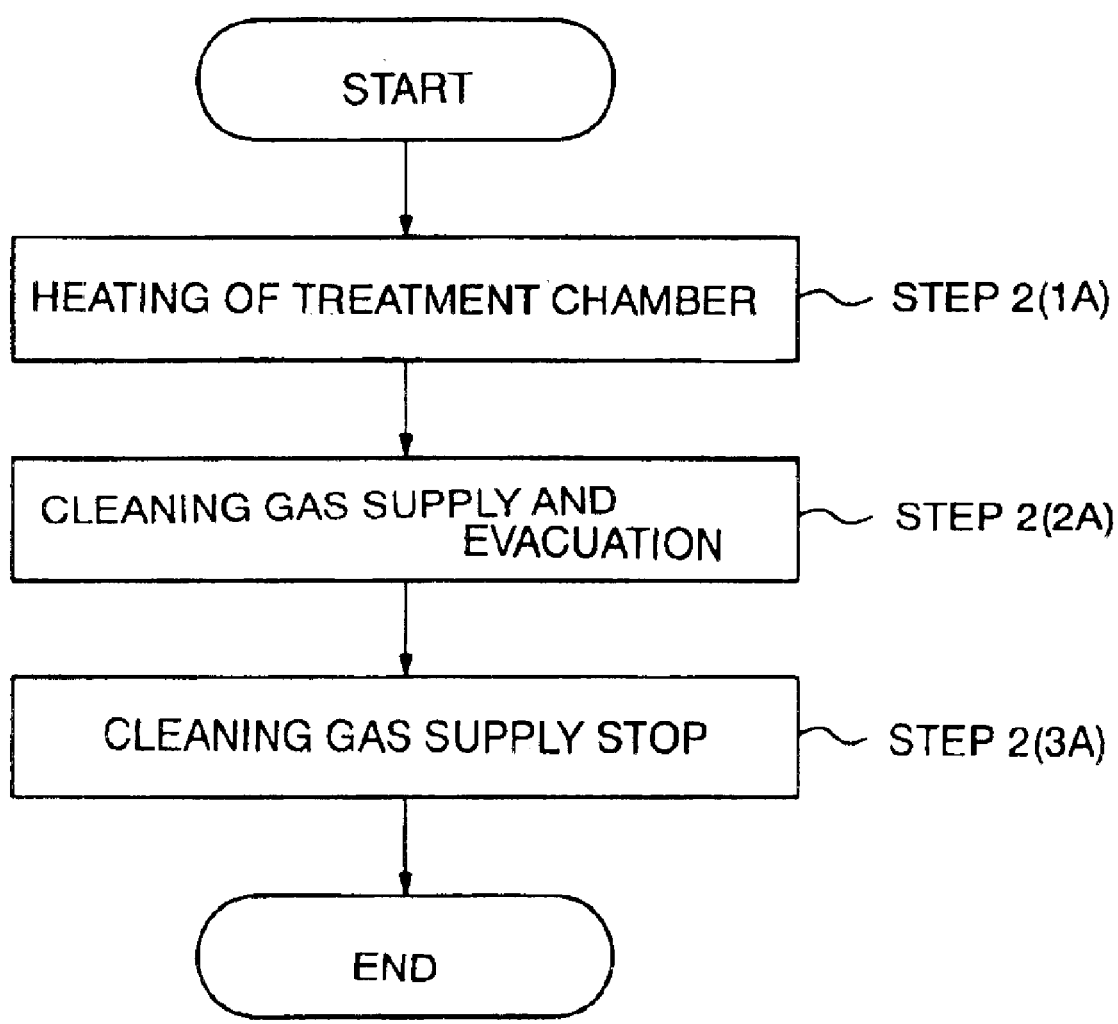

CLEANING METHOD FOR SUBSTRATE TREATMENT DEVICE AND SUBSTRATE TREATMENT DEVICE

TECHNICAL FIELD

The present invention relates to a cleaning method of removing an insulating substance adhering to the inside of a substrate treatment device.

BACKGROUND ART

Conventionally, as a deposition device that forms a thin film of an insulating substance on a surface of a semiconductor wafer (hereinafter, simply referred to as a 'wafer'), for example, a chemical vapor deposition device (CVD device) has been used.

In the CVD device, a wafer is placed on a heated susceptor and a treatment gas is supplied into a treatment chamber to form a thin film of an insulating substrate on the wafer.

The insulating substance remains adhering to an inside wall of the treatment chamber and the susceptor after the thin film of the insulating substance is formed on the wafer. If the thin film formation on the wafer is carried out while the insulating substance adhering to the inside wall of the treatment chamber and the susceptor is being left as it is, the insulating substance is detached from the inside wall of the treatment chamber and the susceptor, which sometimes causes wafer contamination. In order to prevent such wafer contamination, cleaning for removing the insulating substance from the inside wall of the treatment chamber and the susceptor is necessary.

For cleaning, currently proposed is a method of removing the insulating substance through the use of a fluorine-based cleaning gas such as $ClF_3$, $NF_3$, or $C_2F_6$.

In this method, each material existing in the insulating substance, for example, lead zirconate titanate ($Pb(Zr, Ti)O_3$: hereinafter, simply referred to as PZT) or barium strontium titanate ($(Ba, Sr)TiO_3$: hereinafter, simply referred to as BST) is removed after being changed into fluoride.

However, fluoride of especially lead (Pb), zirconium (Zr), barium (Ba), or strontium (Sr) among these materials, is low in vapor pressure. Therefore, it is necessary to increase the temperature in the treatment chamber to as high as 600° C. or higher in order to remove the insulating substance containing these materials.

However, in order to maintain the temperature in the treatment chamber at the time of cleaning (cleaning temperature) at 600° C. or higher, it is necessary to use materials that are not softened at the cleaning temperature of 600° C. or higher for forming the inside wall of the treatment chamber, the susceptor, O-rings, and so on, which poses a problem of lack in realizability.

Even when the cleaning is conducted at 600° C., the use of the fluorine-based cleaning gas has a problem that the fluoride remains in the treatment chamber.

DISCLOSURE OF THE INVENTION

The present invention is made in order to solve the above-mentioned conventional problems, and an object thereof is to provide a cleaning method for a substrate treatment device capable of removing an insulating substance adhering to the inside of a treatment chamber at a low temperature and with reliability.

A cleaning method for a substrate treatment device according to an aspect of the present invention is characterized in that it includes: a complex forming step of supplying a cleaning gas containing a chemical compound having a carboxyl group into a treatment chamber of a substrate treatment device that treats a substrate, to thereby directly turn an insulating substance adhering to the inside of the treatment chamber into a complex; and a complex discharge step of exhausting the inside of the treatment chamber to discharge the complex of the insulating substance out of the treatment chamber. The complex forming step is conducted synchronously with the complex discharge step or before the complex discharge step.

The cleaning method according to the aspect of the present invention enables the formation of the complex of the insulating substance directly at a low temperature since it includes the complex forming step of supplying the cleaning gas containing the chemical compound having the carboxyl group into the treatment chamber of the substrate treatment device that treats the substrate, to thereby directly turning the insulating substance adhering to the inside of the treatment chamber into the complex. As a result, the insulating substance can be removed at a lower temperature and more reliably than when a fluorine-based cleaning gas is used. Further, since the insulating substance is directly turned into the complex, the number of processes in the cleaning can be reduced, so that the insulating substance can be removed in a short time and with ease.

The above-mentioned complex forming step is carried out, for example, before the complex discharge step. When complex forming step is carried out before the complex discharge step, the cleaning gas reaches all over the inside of the treatment chamber. As a result, more reliable removal of the insulating substance is made possible.

The above-mentioned complex forming step and complex discharge step are preferably repeated alternately. The alternate repeat of the complex forming step and the complex discharge step enables complete complex formation and discharging, so that the insulating substance can be removed efficiently.

A cleaning method for a substrate treatment device according to another aspect of the present invention is characterized in that it includes: a complex forming step of supplying a cleaning gas containing a chemical compound having a carboxyl group into a treatment chamber of a substrate treatment device that treats a substrate, to thereby turning a metal-containing insulating substance adhering to the inside of the treatment chamber into a complex; and a complex discharge step of exhausting the inside of the treatment chamber to discharge the complex of the insulating substance out of the treatment chamber.

The above-mentioned insulating substance is, for example, a substance whose vapor pressure is $1.33 \times 10^3$ Pa or lower at 600° C. in a fluoride state. Through the use of the cleaning method according to the aspect of the present invention, the insulating substance can be reliably removed from the inside of the treatment chamber even when the insulating substance is a substance whose vapor pressure is $1.33 \times 10^3$ Pa or lower at 600° C. in the fluoride state.

The above-mentioned insulating substance is, for example, either one of a substance containing Pb, Zr, and Ti and a substance containing Ba, Sr, and Ti. Through the use of the cleaning method according to the aspect of the present invention, the insulating substance can be reliably removed from the inside of the treatment chamber even when the insulating substance is a substance containing Pb, Zr, and Ti or a substance containing Ba, Sr, and Ti.

The above-mentioned chemical compound having the carboxyl group preferably includes an alkyl group directly bonded with the carboxyl group and having a halogen atom. When the chemical compound having the carboxyl group includes the alkyl group directly bonded with the carboxyl group and having the halogen atom, reactivity thereof with the insulating substance can be increased.

The above-mentioned chemical compound having the carboxyl group is preferably trifluoroacetic acid ($CF_3COOH$). The use of the trifluoroacetic acid can further increase the reactivity thereof with the insulating substance.

The above-mentioned substrate treatment device is, for example, a deposition device. Through the use of the cleaning method for the substrate treatment device according to the aspect of the present invention, reliable removal of the insulating substance is possible even for the deposition device in which the insulating substance easily adheres to the inside of the treatment chamber thereof.

BRIEF DESCRIPTION OF THE DRAWINGS

FIG. 4 is a flowchart showing the flow of cleaning performed in the CVD device according to the first embodiment.

BEST MODE FOR CARRYING OUT THE INVENTION

First Embodiment

A substrate treatment device according to a first embodiment of the present invention will be hereinafter explained. In this embodiment, a CVD device that chemically forms a thin film on a film formation surface of a wafer is used for explanation as the substrate treatment device.

Figure 1:
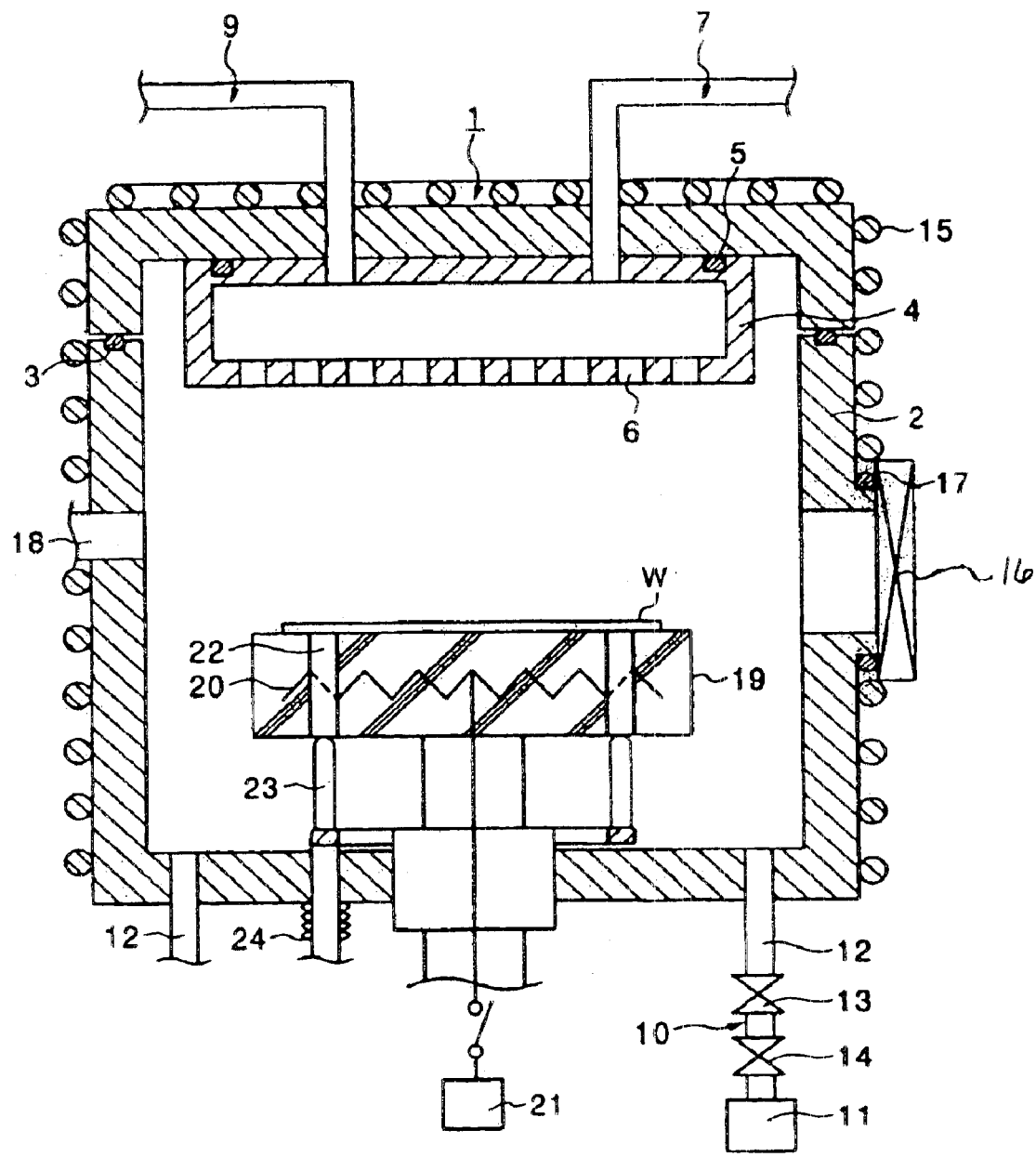
FIG. 1 is a vertical sectional view schematically showing a CVD device according to a first embodiment.

FIG. 1 is a vertical sectional view schematically showing a CVD device according to this embodiment. As shown in FIG. 1, a CVD device 1 includes a process chamber 2 in a substantially cylindrical shape made of, for example, aluminum and stainless steel. The treatment chamber 2 is structured to be vertically separable, and an O-ring 3 is interposed between separable portions.

A showerhead 4 is disposed on a ceiling portion of the treatment chamber 2 via an O-ring 5. A treatment gas for forming a thin film of an insulating substance, for example, PZT or BST on a film formation surface of a wafer W and a cleaning gas for removing the insulating substrate adhering to the inside of the treatment chamber 2 at the time of film formation are supplied into the showerhead 4, so that the treatment gas and the cleaning gas are supplied into the treatment chamber 2.

The showerhead 4 has a hollow structure and has a plurality of discharge ports 6 formed in a lower portion thereof. The plural discharge ports 6 are formed, so that the treatment gas and the cleaning gas supplied into the showerhead 4 diffuse in the showerhead 4 to be discharged uniformly between the showerhead 4 and a susceptor 19 which will be later described.

A treatment gas supply system 7 to supply the treatment gas and a cleaning gas supply system 9 to supply the cleaning gas are connected to an upper portion of the showerhead 4.

An evacuating system 10 to evacuate the inside of the treatment chamber 2 is connected to a bottom portion of the treatment chamber 2. The evacuating system 10 is mainly composed of a vacuum pump 11 such as a turbo molecular pump or a dry pump, an exhaust pipe 12 connected to the vacuum pump 11 and to the bottom portion of the treatment chamber 2, a shutoff valve 13, which is disposed in the exhaust pipe 12, to start or stop the evacuation by opening and closing, and a pressure adjusting valve 14, which is disposed in the exhaust pipe 12, to adjust the pressure inside the treatment chamber 2 by opening and closing. The operation of the vacuum pump 11 causes the inside of the treatment chamber 2 to be evacuated.

A resistance heating element 15 to heat the treatment chamber 2 is wound around the treatment chamber 2. Further, an opening is provided in a sidewall of the treatment chamber 2. A gate valve 16 that opens/closes when the wafer W is carried into and out of the treatment chamber 2 is disposed in a peripheral portion of this opening via an O ring 17.

A purge gas supply system 18 to supply a purge gas, for example, a nitrogen gas is connected to the treatment chamber 2. When the purge gas is supplied into the treatment chamber 2, the pressure in the evacuated treatment chamber 2 is returned to the atmospheric pressure.

A susceptor 19 substantially in a disc shape to place the wafer W thereon is disposed at a position facing the showerhead 4 in the treatment chamber 2. The susceptor 19 is formed of, for example, aluminum nitride, silicon nitride, amorphous carbon, or composite carbon. When the treatment gas is supplied while the wafer W is placed on an upper face of the susceptor 19, the thin film of the insulating substance is formed on the film formation surface of the wafer W.

A susceptor heating member, for example, a resistance heating element or a heating lamp is disposed in the susceptor 19. When the susceptor heating member heats the susceptor 19, the susceptor 19 is heated to a predetermined temperature. In this embodiment, the case when a resistance heating element 20 is used as the susceptor heating member will be explained.

An external power supply 21 disposed outside the treatment chamber 2 is connected to the resistance heating element 20 via a lead wire. Electric current passage to the resistance heating element 20 from the external power supply 21 causes the resistance heating element 20 to generate heat.

The susceptor 19 has lifter holes 22 formed in a vertical direction at, for example, three places thereof. Under the lifter holes 22, three lifter pins 23 are provided to be ascendable/descendible. When a not-shown hoisting/lowering unit drives the lifter pins 23 to descend or ascend, the wafer W is placed on the susceptor 19 or to become apart from the susceptor 19.

The lifter pins 23 pass through the treatment chamber 2, but since extendable/contractible bellows 24 made of metal are provided at portions where the lifter pins 23 pass through the treatment chamber 2, airtightness in the treatment chamber 2 is maintained.

Figure 2:
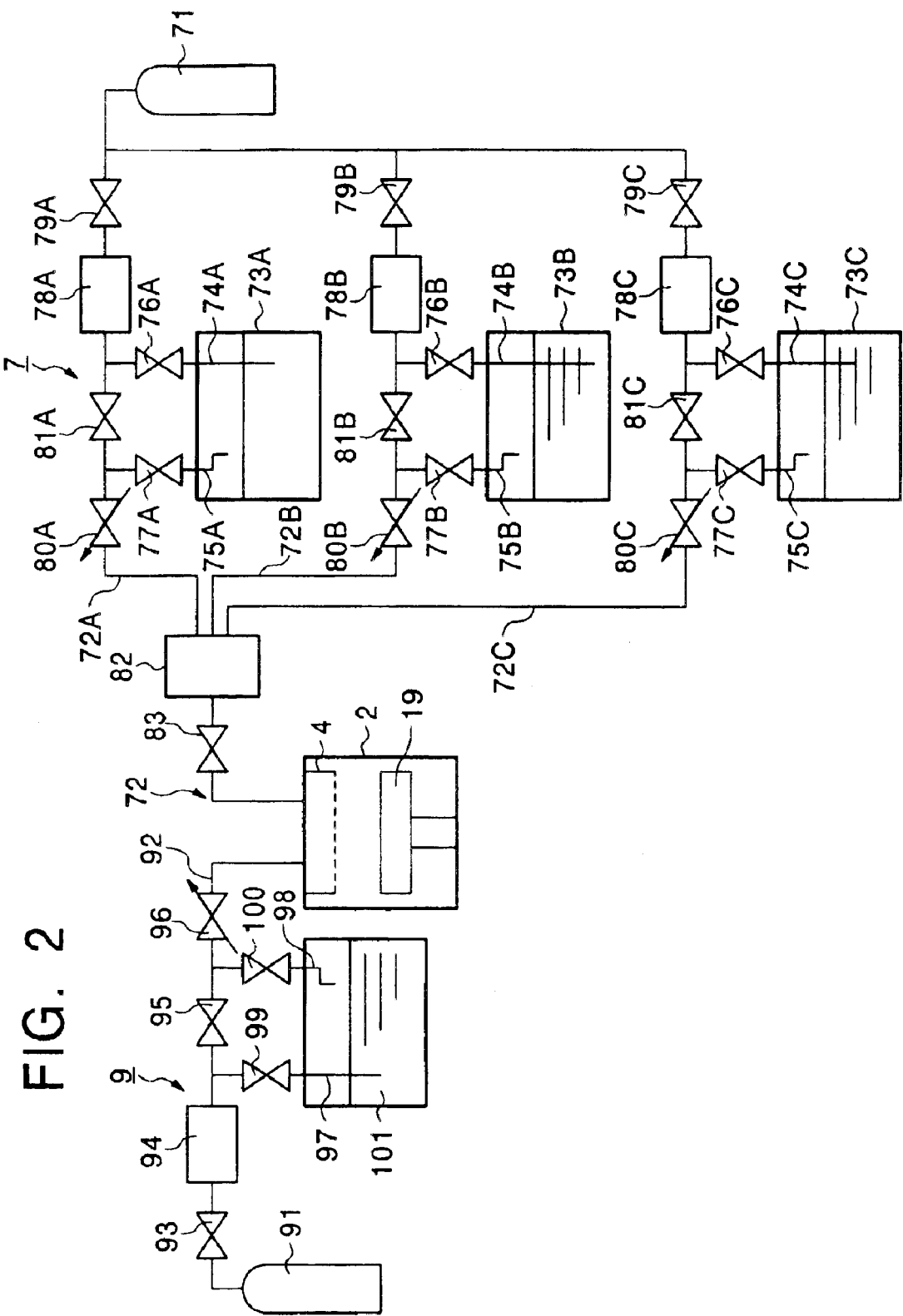
FIG. 2 is a diagram schematically showing a treatment gas supply system and a cleaning gas supply system of the CVD device according to the first embodiment.

Next, the treatment gas supply system 7 and the cleaning gas supply system 9 of the CVD device 1 according to this embodiment will be explained in detail. FIG. 2 is a diagram schematically showing the treatment gas supply system 7 and the cleaning gas supply system 9 of the CVD device 1 according to this embodiment.

As shown in FIG. 2, the treatment gas supply system 7 has a pipe 72 one end of which is connected to the upper portion of the showerhead 4 and the other end of which is connected to a carrier gas tank 71 storing a carrier gas such as an argon gas therein. Here, in the explanation below, the side where the showerhead 4 is provide is defined as a downstream side and the side where the carrier gas tank 71 is provided is defined as an upstream side.

In the case when the thin film of PZT as the insulating substance is formed on the film formation surface of the wafer W, the pipe 72 is branched off into three routes via a treatment gas mixer 82, which will be described later, as shown in FIG. 2. Raw material tanks 73A, 73B, 73C storing raw materials to constitute the treatment gas, for example, a lead-based raw material, a zirconium-based raw material, and a titanium-based raw material respectively are connected to pipes 72A, 72B, 72C, which are the three routes branched off from the pipe 72, via first bypass pipes 74A, 74B, 74C and second bypass pipes 75A, 75B, 75C which are located on the downstream side of the first bypass pipes 74A, 74B, 74C.

The raw material tank 73A stores therein, for example, bis(dipivaloylmethanato)lead (Pb(DPM)$_2$) that is a solid raw material as the lead-based raw material. The raw material tank 73B stores therein, for example, $Zr(t-OC_4H_9)_4$ that is a liquid raw material as the zirconium-based raw material. The raw material tank 73C stores therein, for example, $Ti(i-OC_3H_7)_4$ that is a liquid raw material as the titanium-based raw material.

The first bypass pipes 74A, 74B, 74C have valves 76A, 76B, 76C disposed therein, and the second bypass pipes 75A, 75B, 75C have valves 77A, 77B, 77C disposed therein respectively. When the carrier gas is supplied into the raw material tanks 73A, 73B, 73C from the first bypass pipes 74A, 74B, 74C while the valves 76A, 76B, 76C are opened, the raw materials stored in the raw material tanks 73A, 73B, 73C are bubbled to be vaporized. Then, these vaporized raw materials are supplied to the pipes 72A, 72B, 72C via the second bypass pipes 75A, 75B, 75C.

Mass flow controllers 78A, 78B, 78C to adjust the flow rate of the carrier gas and valves 79A, 79B, 79C are provided in the pipes 72A, 72B, 72C at positions on the upstream side of the first bypass pipes 74A, 74B, 74C, respectively.

The pipes 72A, 72B, 72C have needle valves 80A, 80B, 80C at positions on the downstream side of the second bypass pipes 75A, 75B, 75C to adjust the pressure in the raw material tanks 73A, 73B, 73C.

Further, valves 81A, 81B, 81C are disposed in pipes 72A, 72B, 72C between the first bypass pipes 74A, 74B, 74C and the second bypass pipes 75A, 75B, 75C.

The treatment gas mixer 82 to produce the treatment gas by mixing predetermined ratios of the vaporized raw materials is connected to the pipes 72A, 72B, 72C branched of f as three routes.

The pipe 72 has a valve 83 at a position on the downstream side of the treatment gas mixer 82 to allow the mixed treatment gas to be supplied to the showerhead 4 at a predetermined flow rate.

The cleaning gas supply system 9 has substantially the same structure as the above-described treatment gas supply system 7. To be more specific, assuming the side where the showerhead 4 is provided is defined as the downstream side and the side where a carrier gas tank 91 storing the carrier gas therein is defined as the upstream side, a valve 93, a mass flow controller 94, a valve 95, and a needle valve 96 are arranged in a pipe 92 from the upstream side toward the downstream side.

A first bypass pipe 97 is connected to the pipe 92 between the mass flow controller 94 and the valve 95. A second bypass pipe 98 is connected to the pipe 92 between the valve 95 and the needle valve 96. The first bypass pipe 97 has a valve 99 therein and the second bypass pipe 98 has a valve 100 therein.

Further, a carboxylic acid tank 101 storing carboxylic acid (a chemical compound having a carboxyl group) therein is connected to the first bypass pipe 97 and the second bypass pipe 98. Here, as the carboxylic acid, it is preferable to use carboxylic acid such as, for example, trifluoroacetic acid (TFA), in which an alkyl group bonded directly with the carboxyl group has a halogen atom. Such carboxylic acid is specified as preferable because the halogen atom has a large inductive effect, which has such an influence to reduce the electron density of an oxygen atom of the carboxyl group, so that a hydrogen atom bonded with this oxygen atom is easily dissociated as hydrogen ions. As this dissociation is more easily caused, the reactivity becomes higher.

When the carrier gas is supplied into the carboxylic acid tank 101 from the first bypass pipe 97 while the valve 99 is opened, the carboxylic acid stored in the carboxylic acid tank 101 is bubbled to be vaporized. The vaporized carboxylic acid is supplied into the showerhead 4 as the cleaning gas via the second bypass pipe 98 and the pipe 92.

Next, the flow of a film forming step performed in the CVD device 1 according to this embodiment and a cleaning step for the CVD device 1 will be explained. Note that the vacuum pump 11 is assumed to be in operation during the film forming step and the cleaning step.

Figure 3:
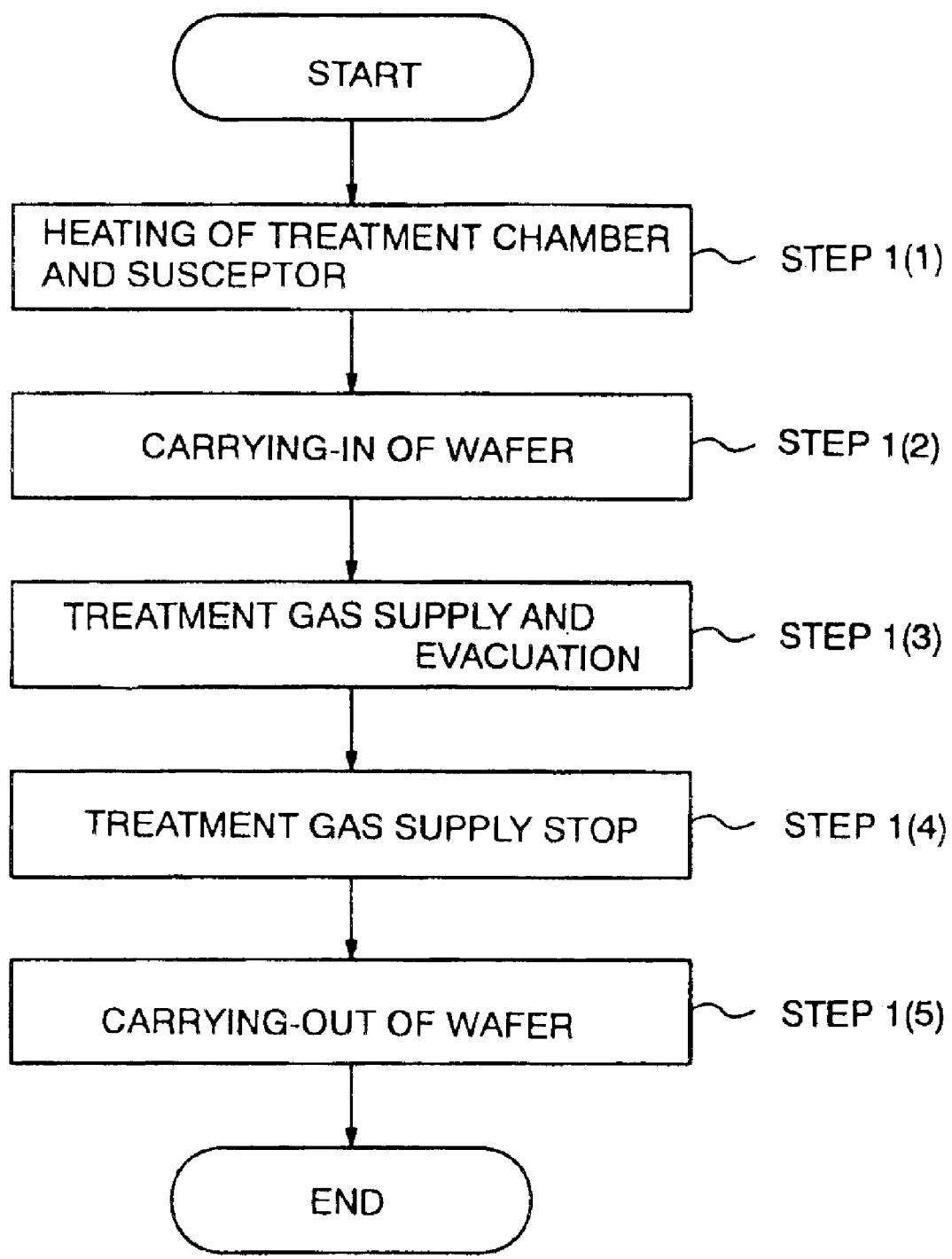
FIG. 3 is a flow chart showing the flow of film formation performed in the CVD device according to the first embodiment.
Figure 5A:
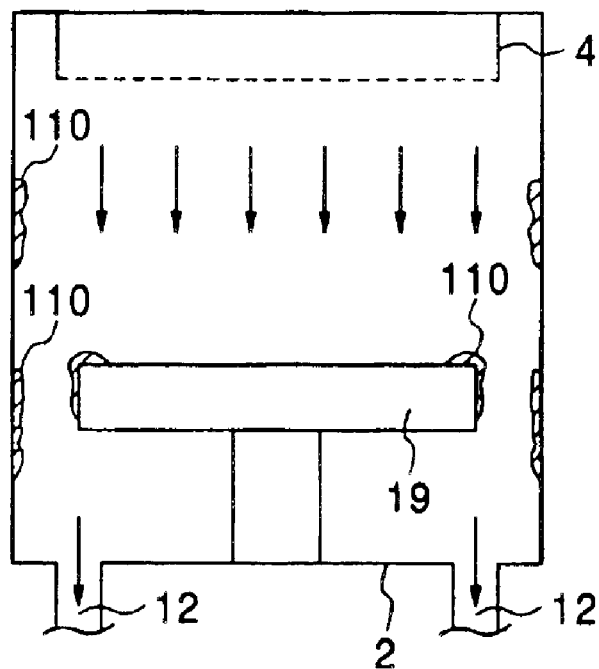
FIG. 5A and FIG. 5B are diagrams schematically showing a cleaning step according to the first embodiment.
Figure 5B:
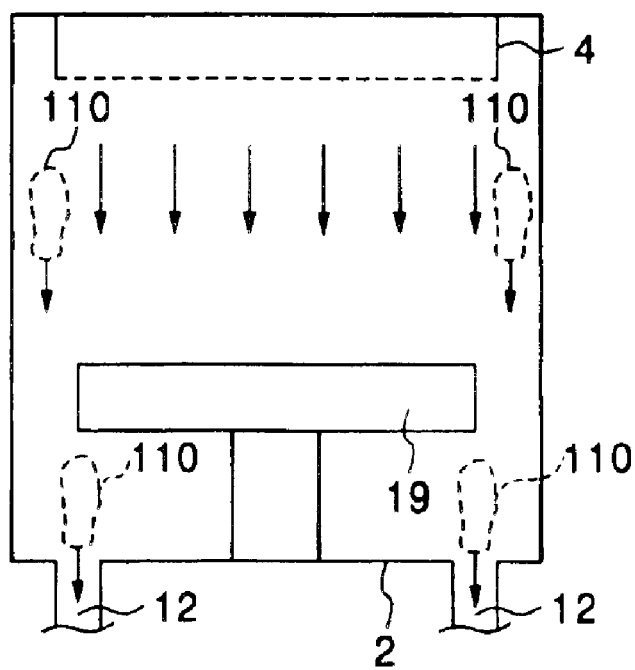

FIG. 3 is a flowchart showing the flow of the film formation performed in the CVD device 1 according to this embodiment, and FIG. 4 is a flowchart showing the flow of cleaning in the CVD device 1 according to this embodiment. FIG. 5A and FIG. 5B are diagrams schematically showing the cleaning step according to this embodiment.

To begin with, the film forming step performed in the CVD device 1 will be explained (Step 1). First, the not-shown external power supply supplies an electric current to the resistance heating element 15 and at the same time, the external power supply 21 supplies an electric current to the resistance heating element 20, thereby heating the treatment chamber 2 and the susceptor 19 to a film forming temperature (Step 1(1)).

After the treatment chamber 2 and the susceptor 19 are heated to the film forming temperature, the gate valve 16 is opened and a not-shown carrier arm carries the wafer W on which the thin film of the insulating substance is not formed into the treatment chamber 2. The wafer W carried into the treatment chamber 2 is placed on the ascended lifter pins 23, and thereafter placed on the susceptor 19 by the descent of the lifter pins 23 (Step 1(2)).

After the wafer W is placed on the susceptor 19, the valves 79A, 79B, 79C, the valves 76A, 76B, 76C, the valves 77A, 77B, 77C, the needle valves 80A, 80B, 80C, and the valve 83 are opened while the mass flow controllers 78A, 78B, 78C adjust the flow rate of the carrier gas, so that the carrier gas is supplied into the raw material tanks 73A, 73B, 73C. This carrier gas bubbles the raw materials in the raw material tanks 73A, 73B, 73C to vaporize the raw materials. The vaporized raw materials are introduced to the treatment gas mixer 82 and supplied into the showerhead 4 as the treatment gas after being mixed together. Then, the treatment gas is discharged from the discharge ports 6 to start the formation of the thin film of the insulating substance on the wafer W. During the thin film formation, the shutoff valve 13 is opened to evacuate the inside of the treatment chamber 2 (Step 1(3)).

Here, when the thin film of the insulating substance is formed on the wafer W, the insulating substance also adheres to the inside of the treatment chamber 2, specifically, for example, an inside wall of the treatment chamber 2 and the susceptor 19.

After the thin film of the insulating substance is formed on the wafer W, the valves 79A, 79B, 79C, the valves 76A, 76B, 76C, the valves 77A, 77B, 77C, the needle valves 80A, 80B, 80C, and the valve 83 are closed to stop the supply of the treatment gas, thereby finishing the formation of the thin film of the insulating substance (Step 1(4)).

After the thin film formation is finished, the lifter pins 23 ascend to separate the wafer W from the susceptor 19 while a purge gas is supplied into the treatment chamber. Thereafter, the gate valve 16 is opened and the not-shown carrier arm carries the wafer W on which the thin film of the insulating substance has been formed out of the treatment chamber 2 (Step 1(5)).

Next, the cleaning step in the treatment chamber 2 will be explained (Step 2). After the wafer W on which the thin film of the insulating substance has been formed is carried out of the treatment chamber 2, the treatment chamber 2 is heated by the resistance heating element 15 to about 300° C. to about 500° C., preferably about 375° C. to about 500° C. (Step 2(1)). Here, the reason why the temperature of the treatment chamber 2 is specified as about 300° C. to about 500° C. is that, when the temperature is higher than this range, the supplied carboxylic acid is decomposed to lower cleaning efficiency. Whereas, when the temperature is lower than this range, the insulating substance adhering to the inside wall of the treatment chamber 2 and the susceptor 19 is not effectively removed.

After the treatment chamber 2 is heated to about 300° C. to about 500° C., the valve 93, the valve 99, the valve 100, the needle valve 96 are opened while the carrier gas, whose flow rate is adjusted by the mass flow controller 94, is supplied into the carboxylic acid tank 101. This carrier gas bubbles the carboxylic acid in the carboxylic acid tank 101 to vaporize the carboxylic acid. The carboxylic acid vaporized by the bubbling is supplied to the showerhead 4 as the cleaning gas to be discharged from the discharge ports of the showerhead 4. Then, the cleaning gas discharged from the discharge ports 6 diffuses inside the treatment chamber 2, so that the cleaning of the inside of the treatment chamber 2 is started. Note that, in this embodiment, the shutoff valve 13 is in an open state, so that the cleaning is carried out together with evacuation (Step 2(2A)).

Here, to specifically explain phenomena occurring during the cleaning, first, the cleaning gas diffuses inside the treatment chamber 2 to come in contact with the insulating substance adhering to the inside of the treatment chamber 2. The contact of the cleaning gas with the insulating substance causes reaction between the cleaning gas and the insulating substance, so that a complex 110 of the insulating substance is formed as shown in FIG. 5A. Further, since the shut off valve 13 is in the open state to evacuate the inside of the treatment chamber 2, the complex 110 of the insulating substance is easily vaporized to be detached from the inside wall of the treatment chamber 2 and the susceptor 19. Further, the detached complex 110 of the insulating substance is quickly discharged out of the treatment chamber 2 via the exhaust pipe 12 as shown in FIG. 5B, so that the insulating substance is removed from the inside of the treatment chamber 2.

Note that the pressure inside the evacuated treatment chamber 2 is preferably maintained at $1.33 \times 10^3$ Pa to $1.33 \times 10^4$ Pa, and is more preferably maintained at $1.33 \times 10^3$ Pa to $6.65 \times 10^3$ Pa. The reason why it is specified that the pressure inside the treatment chamber 2 is preferably maintained at $1.33 \times 10^3$ Pa to $1.33 \times 10^4$ Pa is that the pressure higher than this range makes the vaporization of the complex of the insulating substance difficult. Another reason is that the pressure lower than this range lowers the frequency of the collision of the cleaning gas with the insulating substance adhering to the inside wall of the treatment chamber 2 and the susceptor 19, so that the complex of the insulating substance cannot be effectively produced.

After the insulating substance adhering to the inside of the treatment chamber 2 is fully removed, the valve 93, the valve 97, the valve 99, and the needle valve 96 are closed to stop the supply of the carrier gas and the cleaning gas, thereby finishing the cleaning of the inside of the treatment chamber 2 (Step 2(3A)).

In this embodiment, the cleaning gas containing the carboxylic acid is supplied into the treatment chamber 2 to form the complex of the insulating substance, which makes it possible to remove the insulating substance adhering to the inside of the treatment chamber 2 at a low temperature and with reliability.

Specifically, the vapor pressure of the complex of the insulating substance is higher than the vapor pressure of fluoride of the insulating substance at the same temperature. Therefore, the insulating substance can be vaporized even at a low temperature of 600° C. or lower to enable the removal of the insulating substance adhering to the inside of the treatment chamber 2 at a low temperature.

Moreover, even when the insulating substance contains a substance that is difficult to remove as fluoride since the vapor pressure thereof in a fluoride state is $1.33 \times 10^3$ Pa or lower at 600° C., the formation of the complex ensures the vaporization of the insulating substance and the removal thereof from the inside of the treatment chamber 2.

In this embodiment, since the cleaning is carried out together with the evacuation by opening the shutoff valve 13, it is possible to vaporize the complex immediately after the complex of the insulating substance is produced, so that the insulating substance can be removed from the inside of the treatment chamber 2.

In addition, since the insulating substance is directly turned into the complex by the cleaning gas, the number of processes for the cleaning can be reduced, so that the insulating substance adhering to the inside of the treatment chamber 2 can be removed with ease and in a short time.

Further, the use of the trifluoroacetic acid as the carboxylic acid increases reactivity between the cleaning gas and the insulating substance, which makes it possible to remove the insulating substance from the inside of the treatment chamber 2 with higher reliability and to achieve cost reduction.

Example 1

Hereinafter, Example 1 will be explained. In this example, the CVD device 1 explained in the first embodiment was used, and PZT removal ratio in correlation to temperature was measured when PZT was used as insulating substance.

The measurement conditions will be explained below.

In this example, PZT adhering to the inside wall of the CVD treatment device and the susceptor was not removed, but a thin film of PZT formed on a wafer was removed by a cleaning gas after the wafer having the thin film of PZT formed thereon was placed on the susceptor in the CVD device.

Vaporized trifluoroacetic acid was used as the cleaning gas and the trifluoroacetic acid was supplied into the treatment chamber at 300 sccm. Further, a nitrogen gas was supplied into the treatment chamber at 100 sccm while the pressure adjusting valve was regulated to maintain the pressure inside the treatment chamber at about $3.33 \times 10^3$ Pa.

Ten-minute cleaning was carried out under varied temperatures while the inside of the treatment chamber was maintained in the above-mentioned state.

The measurement result will be described below.

Figure 6:
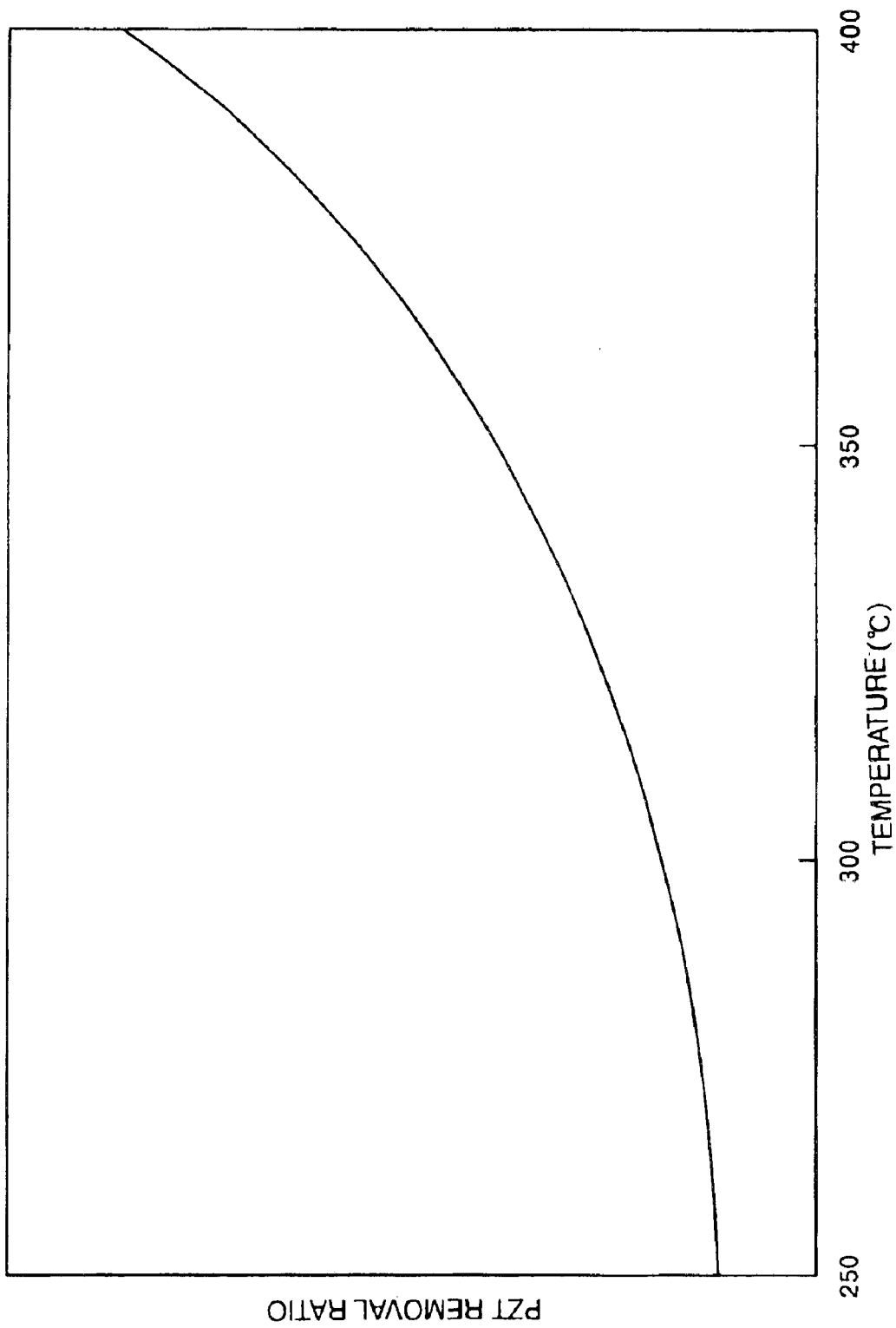
FIG. 6 is a graph showing the correlation between susceptor temperature and PZT removal ratio in the CVD device according to Example 1.

FIG. 6 is a graph showing the correlation between susceptor temperature and PZT removal ratio in the CVD device according to this example. As shown in FIG. 6, it has been confirmed that the PZT removal ratio is increasing in the temperature range of 300° C. to 400° C.

Example 2

Hereinafter, Example 2 will be explained.

In this example, the CVD device 1 explained in the first embodiment was used and PZT removal ratio in correlation to pressure is measured when PZT was used as an insulating substance.

The measurement conditions will be explained below.

In this example, similarly to Example 1 described above, a wafer having a thin film of PZT formed thereon was placed on the susceptor in the CVD device, and the thin film of PZT formed on the wafer W was removed by a cleaning gas.

Vaporized trifluoroacetic acid was used as the cleaning gas, and the trifluoroacetic acid was supplied into the treatment chamber at 300 sccm. Further, a nitrogen gas was supplied into the treatment chamber at 100 sccm and at the same time, the susceptor was kept at 400° C. by the resistance heating element.

Ten-minute cleaning was carried out under varied pressures while the inside of the treatment chamber was maintained in the state described above.

The measurement result will be described below.

Figure 7:
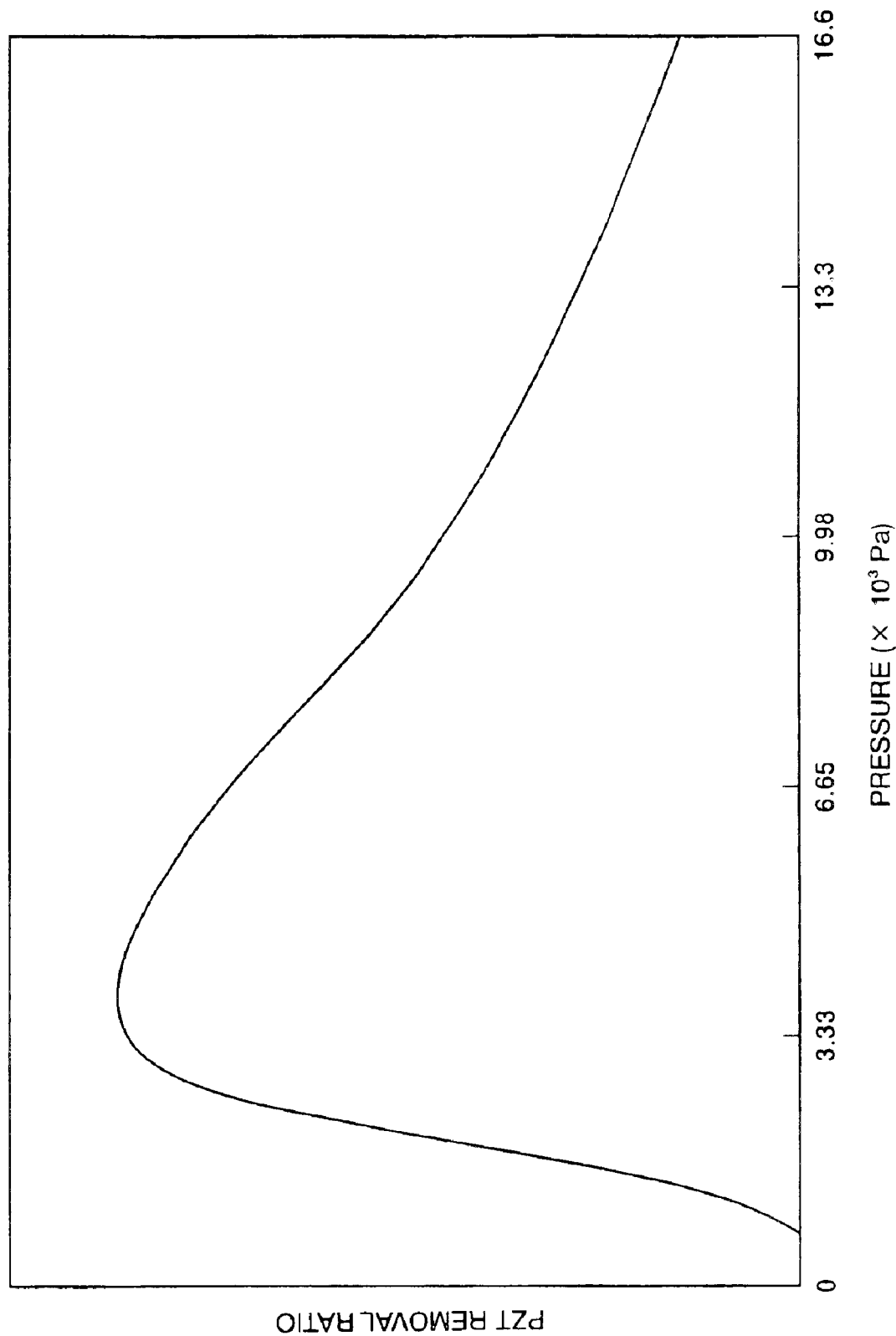
FIG. 7 is a graph showing the correlation between the pressure in the CVD device and PZT removal ratio according to Example 2.

FIG. 7 is a graph showing the correlation between the pressure in the CVD device and PZT removal ratio according to this example. As shown in FIG. 7, it has been confirmed that the PZT removal ratio becomes the highest when the pressure in the treatment chamber is maintained at about $3.33 \times 10^3$ Pa.

Second Embodiment

Hereinafter, a second embodiment of the present invention will be explained. Note that in the explanation below, the contents in this embodiment and the following embodiment that overlap those in the previous embodiment will be omitted in some cases.

Figure 8:
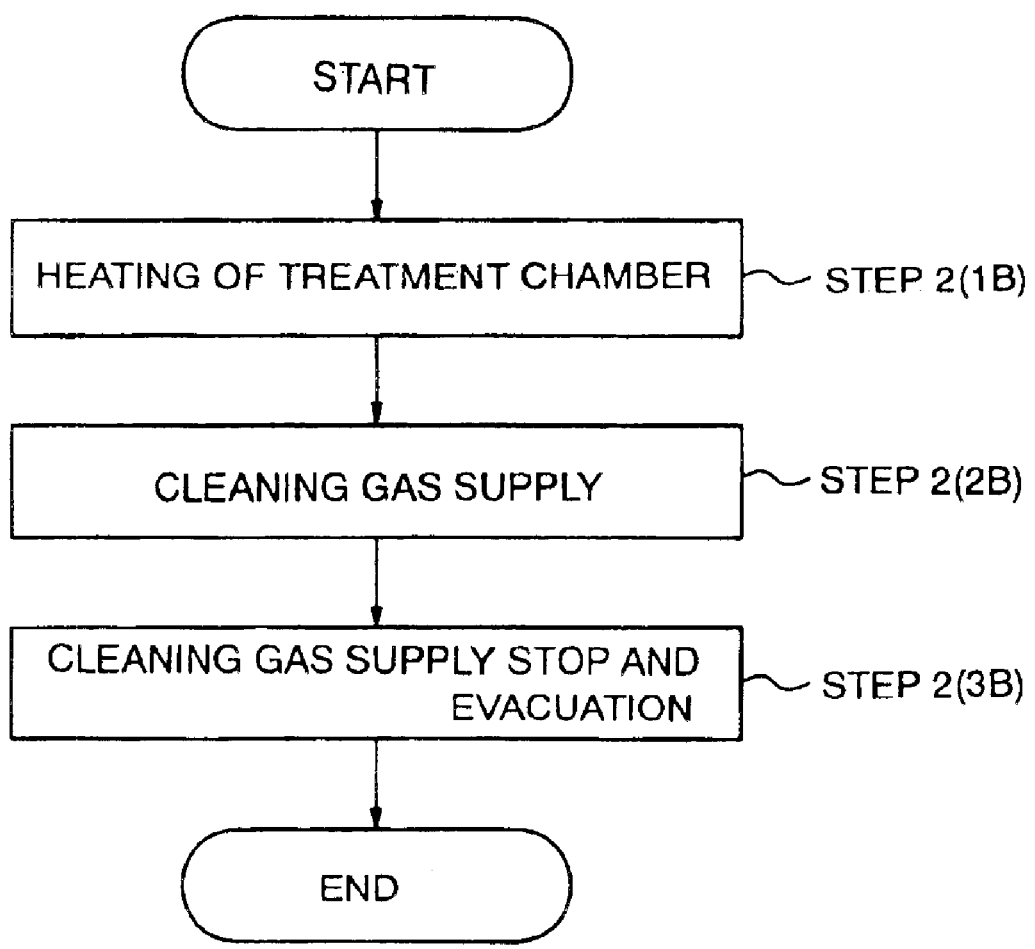
FIG. 8 is a flowchart showing the flow of cleaning performed in a CVD device according to a second embodiment.

In this embodiment, explanation will be given on an example when the inside of a treatment chamber is evacuated after a cleaning gas is retained in the treatment chamber. FIG. 8 is a flowchart showing the flow of cleaning in a CVD device according to this embodiment, and FIG. 9A and FIG. 9B are diagrams schematically showing a cleaning step performed in the CVD device according to this embodiment.

First, a treatment chamber 2 is heated by a resistance heating element 15 wound around the treatment chamber 2 after a wafer W on which a thin film of an insulating substance has been formed is carried out of the treatment chamber 2 (Step 2(1B)).

After the treatment chamber 2 is heated, a valve 93, a valve 99, a valve 100, and a needle valve 96 are opened to supply the cleaning gas into the treatment chamber 2 (Step 2(2B)).

Figure 9A:
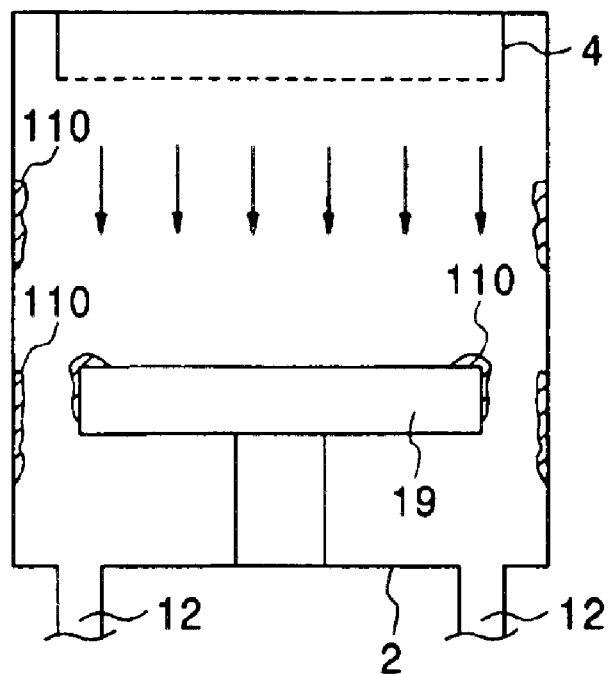
FIG. 9A and FIG. 9B are diagrams schematically showing a cleaning step according to the second embodiment.
Figure 9B:
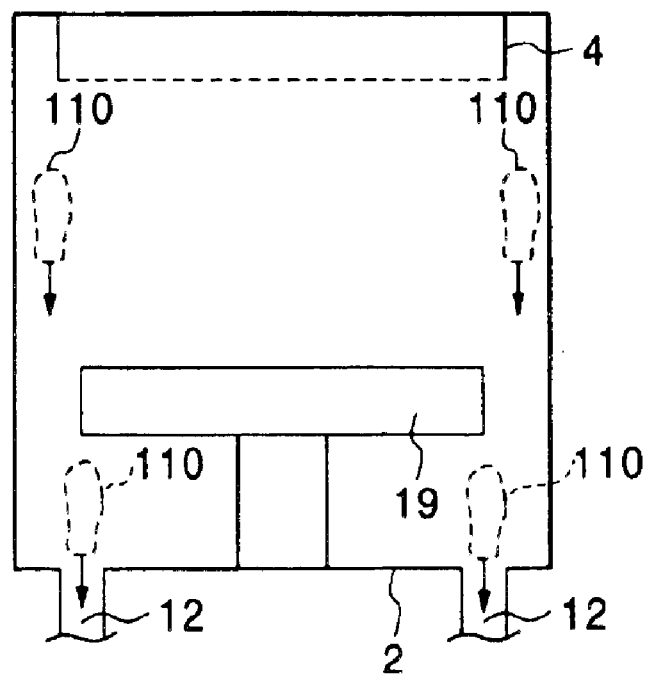

When this cleaning gas diffuses in the treatment chamber 2 to come in contact with the insulating substance adhering to the inside of the treatment chamber 2, a complex 110 of the insulating substance is formed as shown in FIG. 9A. Here, a shutoff valve 13 is closed in this embodiment, so that the cleaning gas supplied into the treatment chamber 2 is retained in the treatment chamber 2 instead of being exhausted.

After the complex 110 of the insulating substance is sufficiently formed, the valve 93, the valve 99, the valve 100, and the needle valve 96 are closed to stop the supply of a carrier gas and the cleaning gas. Further, the shutoff valve 13 is opened to evacuate the inside of the treatment chamber 2 (Step 2(3B)).

The complex 110 of the insulating substance is vaporized by this evacuation to become apart from an inside wall of the treatment chamber 2 and a susceptor 19, and they are quickly discharged out of the treatment chamber 2 via an exhaust pipe 12, as shown in FIG. 9B.

Thereafter, after the complex of the insulating substance is fully discharged out of the treatment chamber 2, the cleaning is finished.

In this embodiment, since the inside of the treatment chamber 2 is evacuated after the cleaning gas is retained in the treatment chamber 2, the cleaning gas reaches all over the inside of the treatment chamber 2, which makes it possible to remove the insulating substance adhering to the inside of the treatment chamber 2 with higher reliability.

Further, the evacuation after the cleaning gas is retained in the treatment chamber 2 enables saving on the cleaning gas, so that cost reduction can be achieved.

Third Embodiment

Figure 10:
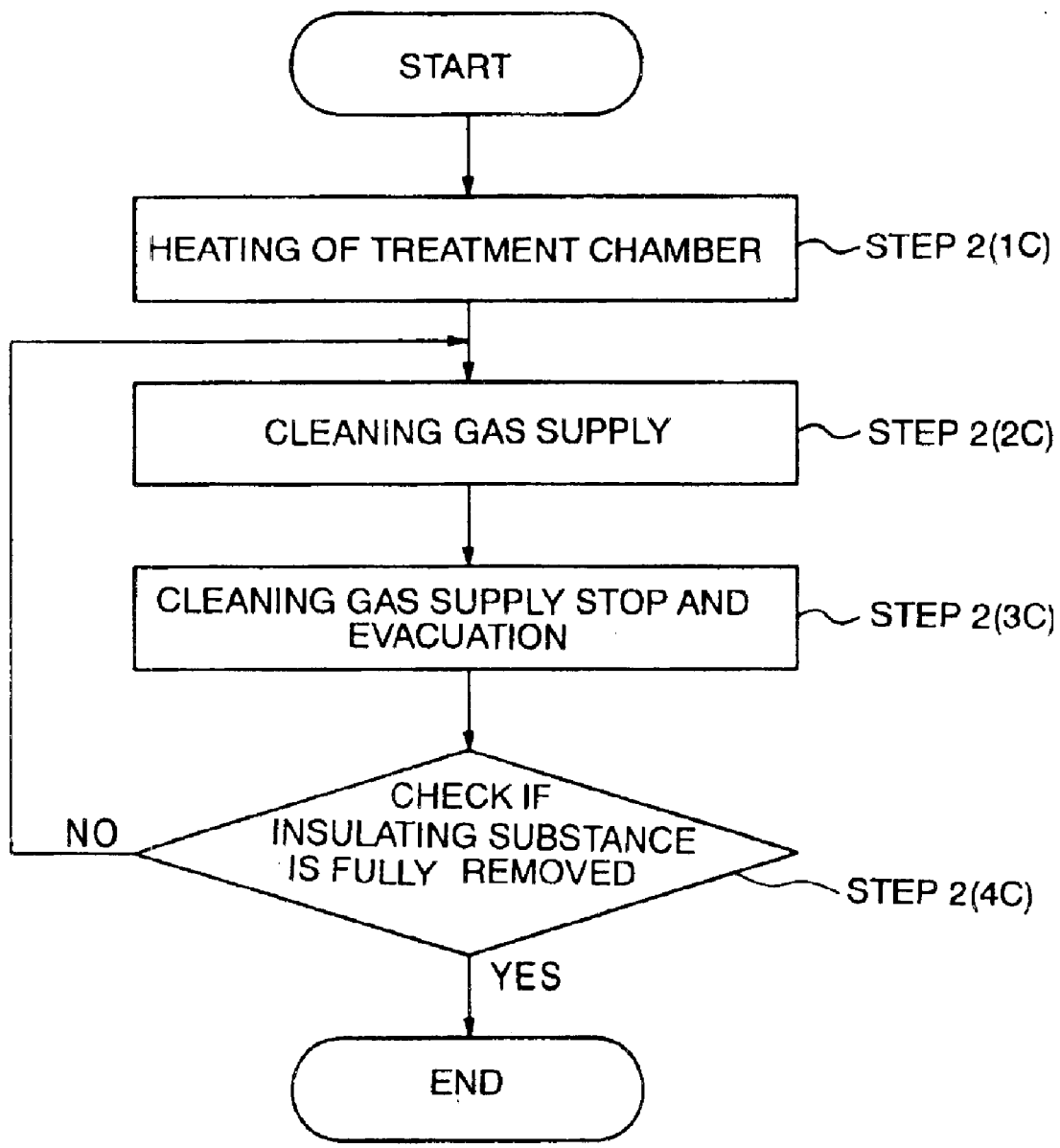
FIG. 10 is a flowchart showing the flow of cleaning performed in a CVD device according to a third embodiment.

Hereinafter, a third embodiment will be explained. In this embodiment, explanation will be given on an example in which a series of processes of retaining a cleaning gas in a treatment chamber and thereafter evacuating the inside of the treatment chamber is repeated. FIG. 10 is a flowchart showing the flow of cleaning in a CVD device according to this embodiment.

As shown in FIG. 10, a treatment chamber 2 is heated by a resistance heating element 15 after a wafer W having a thin film of an insulating substance formed thereon is carried out of the treatment chamber 2 (Step 2(1C)).

After the treatment chamber 2 is heated, a valve 93, a valve 99, a valve 100, and a needle valve 96 are opened to supply a cleaning gas into the treatment chamber 2. A complex of the insulating substance adhering to the inside of the treatment chamber 2 is formed by this cleaning gas (Step 2(2C)).

After the complex of the insulating substance is formed, the valve 93, the valve 99, the valve 100, and the needle valve 96 are closed to stop the supply of the cleaning gas. Further, the shutoff valve 13 is opened to evacuate the inside of the treatment chamber 2 (Step 2(3C)).

After the complex of the insulating substance is fully discharged out of the treatment chamber 2, an amount of the insulating substance adhering to the inside of the treatment chamber 2 is checked (Step 2(4C)). This check work can be conducted by directly checking the insulating substance adhesion state of an inside wall of the treatment chamber 2 or checking a residual amount of the thin film of the insulating substance which is formed on a monitoring wafer. Alternatively, the amount can be checked by infrared spectroscopy, utilizing a not-shown observation window provided in the treatment chamber 2.

When the result of checking the amount of the insulating substance adhering to the inside of the treatment chamber 2 shows that the insulating substance adhering to the inside of the treatment chamber 2 has been fully removed, the cleaning is finished.

On the other hand, when the result of checking the amount of the insulating substance adhering to the inside of the treatment chamber 2 shows that the insulating substance adhering to the inside of the treatment chamber 2 has not been fully removed, the operations from Step 2 (2C) to Step 2 (4C) described above are repeated to perform the cleaning operation until the insulating substance adhering to the inside of the treatment chamber 2 is fully removed.

In this embodiment, a series of processes of retaining the cleaning gas in the treatment chamber 2 and thereafter evacuating the inside of the treatment chamber 2 is repeated, so that complex formation and discharging are performed thoroughly, which enables efficient removal of the insulating substance adhering to the inside of the treatment chamber 2.

It should be noted that the present invention is not limited to the contents described in the first to third embodiments described above, and any changes of the structure, the materials, the disposition of each member, and so on may be made appropriately without departing from the sprit of the present invention. For example, a CVD device utilizing plasma is also usable though the CVD device 1 utilizing heat is used as the CVD device in the explanation on the first to third embodiments.

Further, though the CVD device 1 is used as a substrate treatment device in the explanation in the first to third embodiments, it is also possible to use a deposition device such as a physical vapor deposition device (PVD device) and a plating device, an etching device, or a chemical mechanical polishing device (CMP device).

Further, though the wafer W is used as a substrate in the explanation in the first to third embodiments, an LCD glass substrate can be also used.

INDUSTRIAL APPLICABILITY

A cleaning method for a substrate treatment device according to the present invention is usable in the semiconductor manufacturing industry.

What is claimed is:

1. A cleaning method for a substrate treatment device, comprising:

a complex forming step of supplying a cleaning gas containing a chemical compound having a carboxyl group into a treatment chamber of the substrate treatment device that treats a substrate, to thereby directly turn an insulating substance which adheres to an inside of the treatment chamber into a complex; and a complex discharge step of exhausting the inside of the treatment chamber to discharge the complex of the insulating substance out of the treatment chamber.

2. A cleaning method for a substrate treatment device as set forth in claim 1, wherein said complex forming step is carried out before said complex discharge step.

3. A cleaning method for a substrate treatment device as set forth in claim 1, wherein said complex forming step and said complex discharge step are repeated alternately.

4. A cleaning method for a substrate treatment device, comprising:

a complex forming step of supplying a cleaning gas containing a chemical compound having a carboxyl group into a treatment chamber of the substrate treatment device that treats a substrate, to thereby turn a metal-containing insulating substance adhering to an inside of the treatment chamber into a complex; and a complex discharge step of exhausting the inside of the treatment chamber to discharge the complex of the metal-containing insulating substance out of the treatment chamber.

5. A cleaning method for a substrate treatment device as set forth in claim 4, wherein the metal-containing insulating substance is a substance whose vapor pressure is $1.33 \times 10^3$ Pa or lower at 600° C. in a fluoride state.

6. A cleaning method for a substrate treatment device as set forth in claim 4, wherein the metal-containing insulating substance is either one of a substance containing Pb, Zr, and Ti and a substance containing Ba, Sr, and Ti.

7. A cleaning method for a substrate treatment device as set forth in claim 4, wherein the chemical compound having the carboxyl group includes an alkyl group directly bonded with the carboxyl group and having a halogen atom.

8. A cleaning method for a substrate treatment device as set forth in claim 7, wherein the chemical compound having the carboxyl group is trifluoroacetic acid.

9. A cleaning method for a substrate treatment device as set forth in claim 4, wherein said substrate treatment device is a deposition device.

* * * * *